United States Patent
Pandey et al.

(10) Patent No.: US 10,310,389 B2
(45) Date of Patent: Jun. 4, 2019

(54) METHOD OF MEASURING, DEVICE MANUFACTURING METHOD, METROLOGY APPARATUS, AND LITHOGRAPHIC SYSTEM

(71) Applicant: ASML NETHERLANDS B.V., Veldhoven (NL)

(72) Inventors: Nitesh Pandey, Eindhoven (NL); Jin Lian, Eindhoven (NL); Samee Ur Rehman, Eindhoven (NL); Martin Jacobus Johan Jak, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/942,423

(22) Filed: Mar. 30, 2018

(65) Prior Publication Data

US 2018/0299794 A1  Oct. 18, 2018

(30) Foreign Application Priority Data

Apr. 14, 2017  (EP) ..................................... 17166691
Feb. 15, 2018  (EP) ..................................... 18156860

(51) Int. Cl.
*G01N 21/00*  (2006.01)
*G03F 7/20*  (2006.01)
*G01B 11/02*  (2006.01)

(52) U.S. Cl.
CPC .......... *G03F 7/70633* (2013.01); *G01B 11/02* (2013.01); *G03F 7/70566* (2013.01);
(Continued)

(58) Field of Classification Search
CPC ............. G03F 7/70633; G03F 7/70566; G03F 7/70575; G03F 7/70583; G03F 7/70616; G01B 11/02; G01N 21/00
(Continued)

(56) References Cited

U.S. PATENT DOCUMENTS 7,064,822 B2 *  6/2006  Borden ................ G01N 21/171
                                                     356/237.4
8,411,287 B2      4/2013  Smilde et al.
(Continued)

FOREIGN PATENT DOCUMENTS

TW    201614188    4/2016
TW    201702588    1/2017
(Continued)

OTHER PUBLICATIONS

Extended European Search Report dated Oct. 9, 2017 in corresponding European Application No. 17166691.0.
(Continued)

*Primary Examiner* — Roy M Punnoose
(74) *Attorney, Agent, or Firm* — Pillsbury Winthrop Shaw Pittman LLP

(57) ABSTRACT

Methods and apparatuses for measuring a plurality of structures formed on a substrate are disclosed. In one arrangement, a method includes obtaining data from a first measurement process. The first measurement process including individually measuring each of the plurality of structures to measure a first property of the structure. A second measurement process is used to measure a second property of each of the plurality of structures. The second measurement process includes illuminating each structure with radiation having a radiation property that is individually selected for that structure using the measured first property for the structure.

20 Claims, 8 Drawing Sheets

(52) U.S. Cl.
CPC ...... *G03F 7/70575* (2013.01); *G03F 7/70583* (2013.01); *G03F 7/70616* (2013.01)

(58) Field of Classification Search
USPC ..................................................... 356/237.5
See application file for complete search history.

(56) References Cited

U.S. PATENT DOCUMENTS

| | | |
|---|---|---|
| 8,867,020 B2 | 10/2014 | Smilde et al. |
| 9,081,303 B2 | 7/2015 | Cramer et al. |
| 2002/0125905 A1* | 9/2002 | Borden ............... G01N 21/171 324/754.22 |
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2016/0061590 A1 | 3/2016 | Pandey |
| 2016/0282282 A1 | 9/2016 | Quintanilha et al. |

FOREIGN PATENT DOCUMENTS

| | | |
|---|---|---|
| TW | 201702750 | 1/2017 |
| WO | 2009/078708 | 6/2009 |
| WO | 2009/106279 | 9/2009 |

OTHER PUBLICATIONS

Zhou, Yue et al., "Reducing the overlay metrology sensitivity to perturbations of the measurement stack", Proceedings of SPIE, vol. 10145, pp. 101452G-1-101452G-12 (Mar. 28, 2017).

Bhattacharyya, Kaustuve et al., "A complete methodology towards accuracy and lot-to-lot robustness in on-product overlay metrology using flexible wavelength selection", Proceedings of SPIE, vol. 10145, pp. 101450A-1-101450A-10 (Mar. 28, 2017).

Bhattacharyya, Kaustuve et al., "A study of swing-curve physics in diffraction-based overlay", Proceedings of SPIE, vol. 9778, pp. 97781I-1-97781I-6 (Mar. 24, 2016).

Schmitt-Weaver, Emil et al., "An integrated approach to holistic metrology qualification for multi-patterning process layers", 2016 27th Annual SEMI Advanced Semiconductor Manufacturing, pp. 413-418 (May 2016).

International Search Report issued in PCT Application No. PCT/EP2018/056554, dated Apr. 30, 2018, 4 pages.

Taiwanese Office Action issued in corresponding Taiwanese Patent Application No. 107112022, dated Dec. 28, 2018.

* cited by examiner

US 10,310,389 B2

METHOD OF MEASURING, DEVICE MANUFACTURING METHOD, METROLOGY APPARATUS, AND LITHOGRAPHIC SYSTEM

This application claims the benefit of priority of European patent application no. 17166691, filed Apr. 14, 2017, and European patent application no. 18156860, filed Feb. 15, 2018, the content of each of the foregoing applications is incorporated herein in its entirety by reference.

FIELD

The present description relates to methods and apparatuses for measuring a plurality of structures formed on a substrate, a device manufacturing method, and a lithographic system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection, or over a range of angles of reflection, as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches implemented using rigorous coupled wave analysis or finite element methods; library searches; and principal component analysis.

Targets may be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279 which documents are hereby incorporated in their entireties by reference. Further developments of the technique have been described in U.S. patent application publication nos. US 2011-0027704, US 2011-0043791 and US 2012-0242970. The contents of all these applications are also incorporated herein in their entireties by reference. Diffraction-based overlay using dark-field detection of the diffraction orders enables overlay measurements on smaller targets. These targets can be smaller than the illumination spot and may be surrounded by product structures on a substrate. Targets can comprise multiple periodic structures (e.g., gratings) which can be measured in one image.

Intensity asymmetry between different diffraction orders (e.g. between $-1^{st}$ and the $+1^{st}$ diffraction orders) for a given overlay target provides a measurement of target asymmetry; that is, asymmetry in the target. This asymmetry in the overlay target can be used as an indicator of overlay (e.g., undesired misalignment of two layers or misalignment of two sets of features on a same layer).

SUMMARY

The strength of the intensity asymmetry has been observed to vary between different substrates due to processing variations between different target structures. Variations in the thickness of thin film stacks within target structures can affect the strength of the intensity asymmetry for example. Modelling and/or measurement errors can be reduced by changing properties of the illumination radiation such as the wavelength of the illumination radiation.

It is desirable to improve existing methods and apparatus for measuring plural target structures on a same substrate.

According to an aspect, there is provided a method of measuring a plurality of structures formed on a substrate, the method comprising: obtaining data from a first measurement process, the first measurement process comprising individually measuring each of the plurality of structures to measure a first property of the structure; and using a second measurement process to measure a second property of each of the plurality of structures, the second measurement process comprising illuminating each structure with radiation having a radiation property that is individually selected for that structure using the measured first property for the structure.

According to an aspect, there is provided a metrology apparatus for measuring a plurality of structures on a substrate, the metrology apparatus comprising: a first measurement system configured to perform a first measurement process, the first measurement process comprising individually measuring each of the plurality of structures to measure a first property of the structure; a second measurement system configured to perform a second measurement process, the second measurement process comprising measuring a second property of each of the plurality of structures; and a controller configured to control the second measurement process such that a radiation property of radiation used to illuminate each structure during the second measurement process is individually selected for that structure using the measured first property for the structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

This specification discloses one or more embodiments that incorporate features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
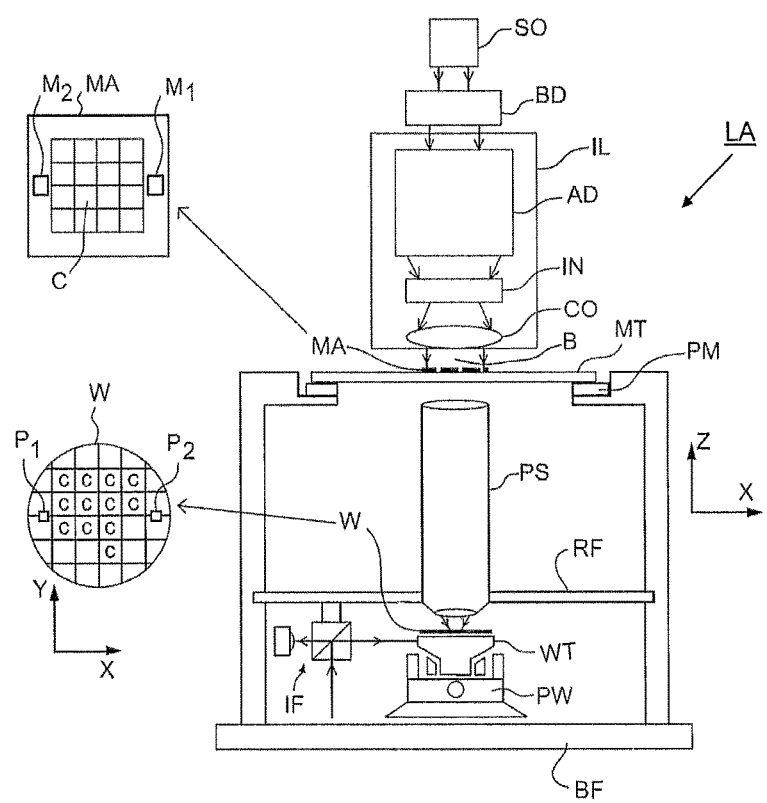
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W. The projection system may be supported on a reference frame RF (which can hold one or more metrology apparatuses), wherein the reference frame may be supported on a base frame BF.

The illumination system may include various types of optical components, such as refractive, reflective, magnetic, electromagnetic, electrostatic, or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and, for example, two or more patterning device tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (which are commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g., after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e., a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
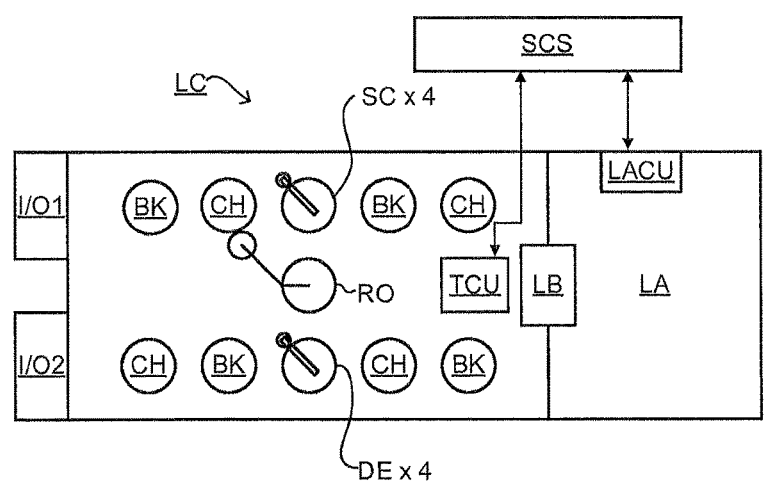
FIG. 2 depicts a lithographic cell or cluster.

As shown in FIG. 2 the lithographic apparatus LA forms part of a lithographic cell LC, also sometimes referred to a lithocell or cluster, which also includes one or more apparatuses to perform pre- and post-exposure processes on a substrate. Conventionally these include one or more spin coaters SC to deposit resist layers, one or more developers DE to develop exposed resist, one or more chill plates CH and/or one or more bake plates BK. A substrate handler, or robot, RO picks up substrates from input/output ports I/O1, I/O2, moves them between the different process apparatuses and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatuses can be operated to maximize throughput and processing efficiency.

In order that the substrates that are exposed by the lithographic apparatus are exposed correctly and consistently, it is desirable to inspect exposed substrates to measure one or more properties such as overlay (e.g., between subsequent layers), line thicknesses, critical dimensions (CD), etc. If errors are detected, adjustments, for example, can be made to exposures of subsequent substrates, especially if the inspection can be done soon and fast enough that other substrates of the same batch are still to be exposed. Also, already exposed substrates may be stripped and reworked to improve yield, or possibly be discarded, thereby avoiding performing exposures on substrates that are known to be faulty. In a case where only some target portions of a substrate are faulty, further exposures can be performed only on those target portions that are deemed to be non-faulty.

A metrology apparatus is used to determine the one or more properties of the substrates, and in particular, how the properties of different substrates or different layers of the same substrate vary from layer to layer. The metrology apparatus may be integrated into the lithographic apparatus LA or the lithocell LC or may be a stand-alone device. To enable most rapid measurements, it is desirable that the metrology apparatus measure properties in the exposed resist layer immediately after the exposure. However, the latent image in the resist has a very low contrast, as in there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image, at which point either the exposed or unexposed parts of the resist have been removed, or after a pattern transfer step such as etching. The latter possibility limits the possibilities for rework of faulty substrates but may still provide useful information.

Figure 3A:
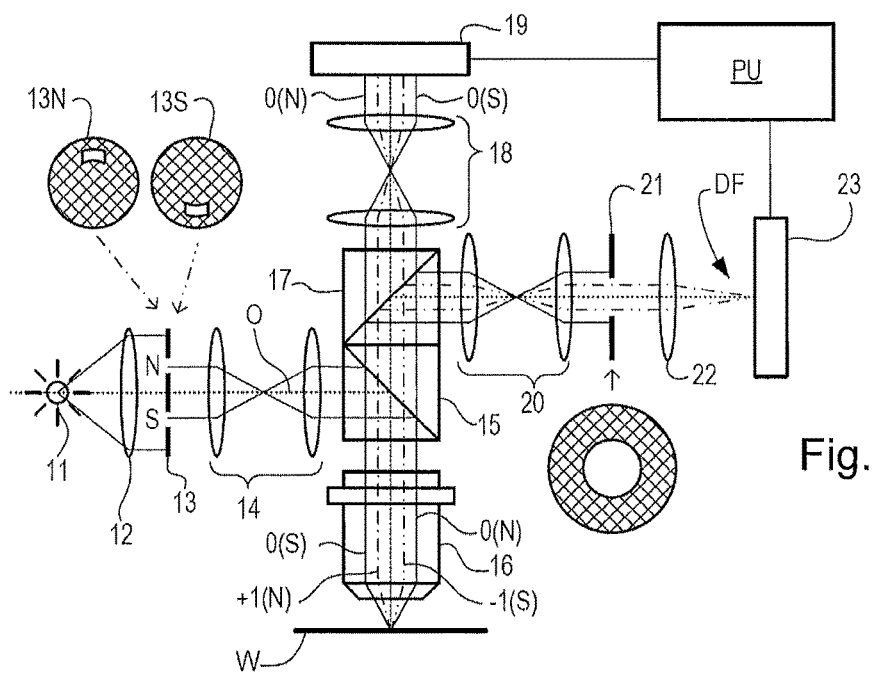
FIG. 3A is a schematic diagram of a metrology apparatus for use in measuring targets using a first pair of illumination apertures.

An example metrology apparatus is shown in FIG. 3A. A target T and diffracted rays of measurement radiation used to illuminate the target are illustrated in more detail in FIG. 3B. The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figure 3B:
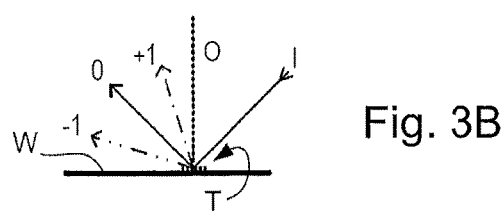
FIG. 3B is a schematic detail of diffraction spectrum of a target periodic structures for a given direction of illumination.

As shown in FIG. 3B, target T is placed with substrate W normal to the optical axis O of objective lens 16. The substrate W may be supported by a support (not shown). A ray of measurement radiation I impinging on target T from an angle off the axis O gives rise to a zeroth order ray (solid line O) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIG. 3A and FIG. 3B are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted radiation to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. The use of these, and numerous other variations and applications of the apparatus are described in prior published applications, mentioned above.

Figure 3C:
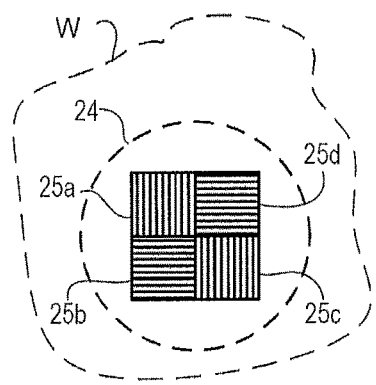
FIG. 3C is a schematic depiction of a form of multiple periodic structure target and an outline of a measurement spot on a substrate.

FIG. 3C depicts a (composite) target formed on a substrate according to known practice. The target in this example comprises four periodic structures 25a to 25d positioned closely together so that they will all be within a measurement scene or measurement spot 24 formed by the metrology radiation illumination beam of the metrology apparatus. The four periodic structures thus are all simultaneously illuminated and simultaneously imaged on sensors 19 and 23. In an example dedicated to measurement of overlay, periodic structures 25a to 25d are themselves composite periodic structures formed by overlying periodic structures that are patterned in different layers of the device formed on substrate W. Periodic structures 25a to 25d may have differently biased overlay offsets (deliberate mismatch between layers) in order to facilitate measurement of overlay between the layers in which the different parts of the composite periodic structures are formed. Such techniques are well known to the skilled person and will not be described further. Periodic structures 25a to 25d may also differ in their orientation, as shown, so as to diffract incoming radiation in X and Y directions. In one example, periodic structures 25a and 25c are X-direction periodic structures with biases of the +d, −d, respectively. Periodic structures 25b and 25d are Y-direction periodic structures with offsets +d and −d respectively. Separate images of these periodic structures can be identified in the image captured by sensor 23. This is only one example of a target. A target may comprise more or fewer than four periodic structures, or only a single periodic structure.

Figure 3D:
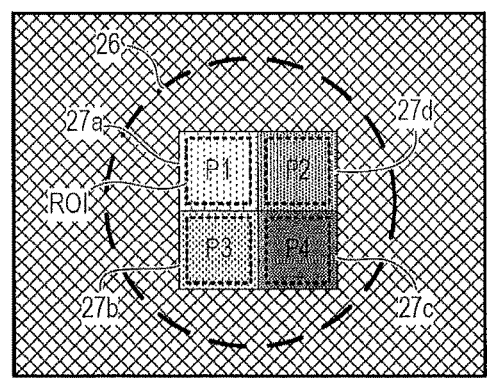
FIG. 3D is a schematic depiction of an image of the target of FIG. 3C obtained in the metrology apparatus of FIG. 3A.

FIG. 3D shows an example of an image that may be formed on and detected by the sensor 23, using the target of FIG. 3C in the apparatus of FIG. 3A. While the pupil plane image sensor 19 cannot resolve the different individual periodic structures 25a to 25d, the image sensor 23 can do so. The dark rectangle represents the field of the image on the sensor, within which the illuminated spot 24 on the substrate is imaged into a corresponding circular area 26. Within this, rectangular areas 27a to 27d represent the images of the small target periodic structures 25a to 25d. If the targets are located in product areas, product features may also be visible in the periphery of this image field. Image processor and control system PU processes these images using pattern recognition to identify the separate images 27a to 27d of periodic structures 25a to 25d. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

A typical target structure for overlay measurement comprises two periodic structure (e.g., gratings) formed in different layers at a same location on the substrate W. The two periodic structures are separated by one or more thin films (a thin film stack) that are deposited as part of the device structure being manufactured. For example, a typical DRAM manufacturing process uses a series of oxide and nitride thin films between the lower and upper periodic structures, with the upper periodic structure being printed on an anti-reflection and hardmask thin film.

The thickness of the thin film stack in each target structure varies according to the position of the target structure due to processing variations. The thickness of the thin film stack has a direct impact on the reflectance properties of the thin film stack. Processing such as chemical mechanical planarization and/or etching may additionally cause asymmetry in the lower periodic structure. This is generally referred to as "bottom grating asymmetry". The bottom grating asymmetry causes further variation in reflectance properties. The bottom grating asymmetry is particularly problematic because it contributes asymmetrically to detected intensities and therefore contributes to errors in measurements or modelling that rely on asymmetry, such as for obtaining overlay.

The strength of the intensity asymmetry from the property of interest (e.g. overlay) depends on one or more properties of the measurement radiation used. The strength of the intensity asymmetry may vary, for example, as a function of the central wavelength, bandwidth and/or polarization of the measurement radiation. The strength of the intensity asymmetry may be referred to as sensitivity. A curve of predicted sensitivity against a property of interest may be generated. Such curves are known as swing curves. For high accuracy it is desirable to select one or more properties of the measurement radiation which correspond to peaks or valleys in the swing curves. Measuring at, e.g., a peak of a swing curve may improve the accuracy with which the property of interest is obtained because modelling errors may be reduced (formulae used for obtaining overlay, for example, may be more accurate at the peaks of the swing curves). Furthermore, measuring at the peaks of the swing curve may provide a stronger signal, which makes measurements more robust against noise.

An optimum property of the measurement radiation may not be invariant over the substrate W. This may arise for example due to process variations across the substrate W that lead to variations in the target structures, for example differences in the thickness of the thin film stack between the upper and lower periodic structures and/or differences in bottom grating asymmetry. As described in detail below, embodiments are disclosed which allow errors in metrology measurements to be further reduced relative to current approaches by varying one or more properties of the measurement radiation adaptively as a function of the location of the target structure to be measured on the substrate W. The measurement radiation is individually tuned on a target structure by target structure basis rather than on a substrate by substrate basis. In an embodiment for overlay target structures, reduced overlay errors (errors in overlay measurements) are observed.

As a detailed illustration of the concept, the discussion below demonstrates how the effect of bottom grating asymmetry can be minimized by selecting a wavelength of the measurement radiation to be at a peak of a sensitivity curve on a target by target basis. Due to process variations, the position of the peak of the sensitivity curve varies as a function of the location of the target structure on the substrate W due to variations in the thin film stack between the upper and lower periodic structures of the target structures.

Figure 4:
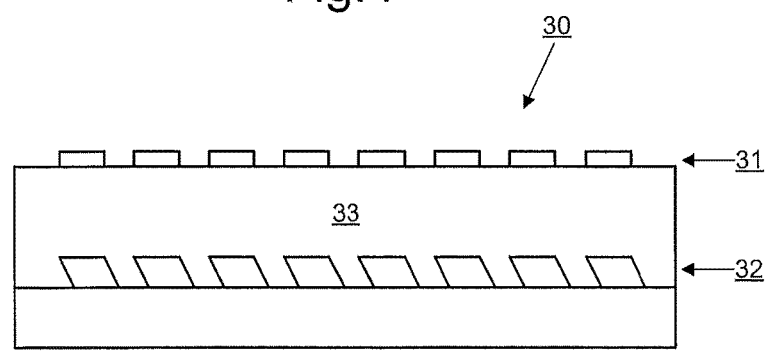
FIG. 4 depicts an embodiment of a target structure with an example of bottom grating asymmetry.
Figure 5:
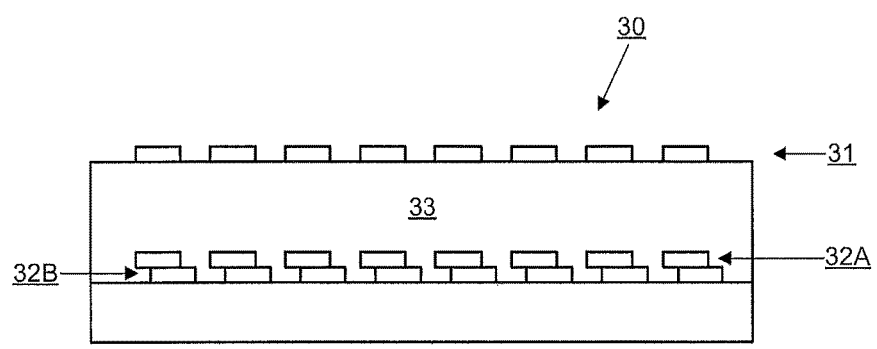
FIG. 5 depicts an example modeling of the target structure of FIG. 4 by splitting the asymmetric lower periodic structure into two phase-shifted symmetric periodic structures.

FIGS. 4 and 5 depict how a target structure 30 can be modeled. As depicted in FIG. 4, the target structure 30 comprises an upper periodic structure (e.g., grating) 31 and a lower periodic structure (e.g., grating) 32. The upper periodic structure 31 is separated from the lower periodic structure 32 by a thin film stack 33. The lower periodic structure 32 is deformed due to bottom grating asymmetry. FIG. 5 depicts how the target structure 30 can be modeled by notionally splitting the asymmetric lower periodic structure 32 into two separate periodic structures 32A and 32B, displaced laterally relative to each other to approximate the asymmetry.

The diffracted signals from the upper periodic structure 31 and each of the two lower periodic structures 32A and 32B can be rigorously solved using Maxwell's equations. An intuitive understanding can be obtained, however, using a scalar approach with some approximations, as described below.

The total signal can be expressed as the sum of the diffracted waves from the upper periodic structure 31 and from each of the two lower periodic structures 32A,32B, The $+1^{st}$ and $-1^{st}$ orders diffracted by the upper periodic structure 31 can be written as $Ae^{i\alpha}$ and $Ae^{-i\alpha}$ where A is the amplitude, $\alpha$ is the position dependent phase term, given by $$\alpha = \frac{2\pi OV}{P}$$

with OV being the overlay term, and P being the pitch of the periodic structure.

The diffraction from the lower periodic structures 32A, 32B can be expressed similarly as $Be^{i\beta}e^{i\gamma}+Be^{i\beta}e^{i\delta}Ce^{i\eta}$ as the $+1^{st}$ order and $Be^{i\beta}e^{i\gamma}+Be^{i\beta}e^{i\delta}Ce^{-i\eta}$ as the $-1^{st}$ order, where $\beta$ is the thickness induced phase acquired during propagation through the thin film of thickness d, given by $$\beta = \frac{4\pi nd}{\lambda},$$

with n being the retractive index of the thin film separating the periodic structures, $\lambda$ being the wavelength for measurement, $\delta$ being the additional phase acquired due to the extra propagation till the lowermost lower periodic structure 32B; and $\eta$ being the phase due to the shift of the lowermost lower periodic structure 32B (i.e. the bottom grating asymmetry) and C being the amplitude of the diffracted wave from the lowermost lower periodic structure 32B.

The total electric field of the $+1^{st}$ order due to the combination of these three diffracted waves is given by $$E_{+1}=Ae^{i\alpha}+Be^{i\beta}e^{i\gamma}+Be^{i\beta}e^{i\delta}Ce^{i\eta}$$

Since the intensity is detected, the total intensity of the $+1^{st}$ order detected is $$I_{+1}=|Ae^{i\alpha}+Be^{i\beta}e^{i\gamma}+Be^{i\beta}e^{i\delta}Ce^{i\eta}|^2$$

and the intensity of the $-1^{st}$ order is $$I_{-1}=|Ae^{i\alpha}+Be^{i\beta}e^{i\gamma}+Be^{i\beta}e^{i\delta}Ce^{-i\eta}|^2$$

These expressions can be written as follows:

$$I_{+1}=|A|^2+|B|^2+|B'|^2+2|A||B|\cos(-\alpha-(\beta+\gamma))+ \\ 2|B||B'|\cos(-\gamma-(\delta-\eta))+2|A||B'|\cos(-\alpha-(\beta+\delta-\eta))$$

$$I_{-1}=|A|^2+|B|^2+|B'|^2+2|A||B|\cos(-\alpha-(\beta+\gamma))+ \\ 2|B||B'|\cos(-\gamma-(\delta-\eta))+2|A||B'|\cos(-\alpha-(\beta+\delta-\eta))$$

with $|B'|=|B||C|$ and the resulting overlay signal being the difference in intensities, given by $$\Delta I=4|A||B|\sin\alpha-4|B||B'|\sin\eta\sin\delta+4|A||B'|\sin(\beta+\delta)\sin(\alpha-\eta)$$

$\alpha$ is small because typical overlay numbers are much smaller than the pitch of the periodic structure used, which means that $\Delta I$ can be written as $$\Delta I \approx \alpha(4|A||B|\sin\beta+4|A||B'|\sin(\beta+\delta))-4|A||B'|\sin(\beta+\delta)\eta+4|B||B'|\sin\eta\sin\delta$$

When two overlay targets are biased with respect to each other by a bias d, $\Delta I$ for each of the two biases are given by $$\Delta I_{+d} = \left(\alpha + \frac{2\pi d}{P}\right)(4|A||B|\sin\beta + 4|A||B'|\sin(\beta+\delta)) - \\ 4|A||B'|\sin(\beta+\delta)\eta + 4|B||B'|\sin\eta\sin\delta$$

$$\Delta I_{-d} = \left(\alpha - \frac{2\pi d}{P}\right)(4|A||B|\sin\beta + 4|A||B'|\sin(\beta+\delta)) - \\ 4|A||B'|\sin(\beta+\delta)\eta + 4|B||B'|\sin\eta\sin\delta$$

with the overlay being calculated by the formula $$OV_r = 2d\frac{\Delta I_{+d}+\Delta I_{-d}}{\Delta I_{+d}-\Delta I_{-d}}$$

$$OV_r = OV + 2d\frac{4|B||B'|\sin\eta\sin\delta - 4|A||B'|\sin(\beta+\delta)\eta}{4|A||B|\sin\beta + 4|A||B'|\sin(\beta+\delta)}$$

$$OV_r \cong OV + 2d\frac{4\eta|B'|(|B|\sin\delta - 4|A|\sin(\beta+\delta))}{4|A||B|\sin\beta + 4|A||B'|\sin(\beta+\delta)}$$

The above equation shows that the retrieved overlay is the true overlay with an error term. The error term can be minimized when $|A| \approx |B|$ i.e., when the periodic structures are balanced in diffraction efficiency. This can be achieved by target design optimization.

The error term can also be reduced by maximizing the denominator term. The denominator is similar to the $\Delta I$ term discussed above. This means that if the measurement wavelength is chosen such that the intensity difference between the two orders is maximized, the error due to the bottom grating asymmetry will be minimized. Thus, the error over all locations on the substrate W can be minimized by adjusting the wavelength of measurement radiation to stay at the peak of the curve of sensitivity against wavelength (the swing curve).

It has been recognized that it is possible to predict how much the wavelength needs to be adjusted before the overlay measurement by using information derived from a separate sensor. A focus sensor can conveniently be used to provide the necessary information, for example. As described below, this is possible because the focus sensor is sensitive to the same thin film variations which affect the overlay error.

Figure 6:
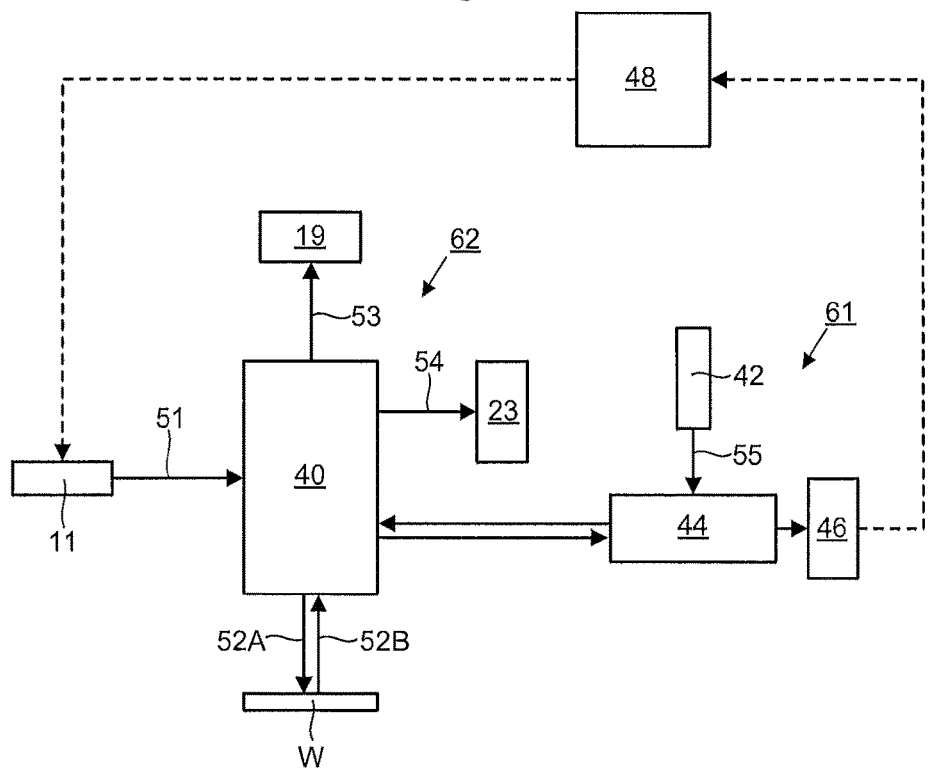
FIG. 6 depicts a metrology apparatus comprising a first measurement system, second measurement system, and control system.

FIG. 6 depicts an example metrology apparatus based on the above principles. The metrology apparatus comprises a first measurement system 61 and a second measurement system 62. The metrology apparatus may be provided as part of a lithographic system, for example as described above with reference to FIGS. 1 and 2. The metrology apparatus is configured to measure a plurality of structures on a substrate W. In an embodiment the plurality of structures are formed on the substrate W by a lithographic process. In an embodiment the plurality of structures comprise target structures for measuring a parameter of a lithographic process, such as overlay. The metrology apparatus may be used in a device manufacturing method comprising forming the plurality of the structures using lithography and measuring the plurality of structures using the metrology apparatus.

The first measurement system 61 performs a first measurement process. The first measurement process comprises individually measuring each of the plurality of structures to measure a first property of the structure. In an embodiment, the first measurement system 61 comprises a first radiation source 42. The first radiation source 42 illuminates each structure with radiation 55 via an optical system 44.

The second measurement system 62 performs a second measurement process. The second measurement process comprises measuring a second property of each of the plurality of structures. In an embodiment, the second measurement system 62 comprises a second radiation source 11. The second radiation source 11 also illuminates each structure with radiation. In an embodiment, the first radiation source 42 is different from the second radiation source 11, for example configured to output radiation having one or more different properties and/or housed in a separate device. The radiation from the first radiation source 42 is configured to be suitable for performing the first measurement process. The radiation from the second radiation source 11 is configured to be suitable for performing the second measurement process.

The second measurement system 62 comprises an optical system 40 configured to direct radiation 51 from the first radiation source 11 onto the substrate W as incident radiation 52A. Redirected radiation 52B from the substrate W is directed by the optical system 40 onto one or more sensors 19,23. In an embodiment, the second measurement system 62 comprises a metrology apparatus of the type described above with reference to FIG. 3. In embodiments of this type, the optical system 40 may comprise lenses 12 and 14 and an objective lens 16, as depicted in FIG. 3A. The optical system 40 may further comprise a beam splitter 15 configured to direct the radiation 51 towards the substrate W, as depicted in FIG. 3A. The optical system 40 may further comprise either or both of the first measurement branch and the second measurement branch. In the particular example of FIG. 6, both of these measurement branches are provided. Example details of the optical elements of each of the measurement branches are depicted in FIG. 3A. An output 53 from the first measurement branch is directed to the sensor 19. An output 54 from the second measurement branch is directed to the sensor 23.

In an embodiment, the second property of each structure measured by the second measurement process comprises overlay (e.g., undesired misalignment between different layers of the structure).

In an embodiment, the first measurement system 61 comprises one or more optical elements that are also used by a focus measurement system configured to measure a focus of the optical system 40 used by the second measurement system 62. Focus measurement systems are commonly incorporated into metrology apparatus to allow target structures to be aligned and/or brought to focus prior to measurements being performed that use the target structures. In an embodiment, the one or more optical elements are not used by the second measurement system 62. In the example of FIG. 6, the first measurement system 61 uses an optical system 44 of the focus measurement system and a focus sensor 46 of the focus measurement system. Radiation from the first radiation source 42 (which may or may not be the same radiation source that is used when the focus measurement system is measuring focus) is directed via the optical system 44 and the optical system 40 onto the substrate W. In an embodiment, the optical system 40 comprises a further beam splitter as part of the objective lens 16 (see FIG. 3A) to direct radiation from the first radiation source 42 from the optical system 44 to the substrate W and back from the substrate W to the optical system 44. The first measurement process uses an output from the focus sensor 46. In an embodiment, the first property of each structure measured by the first measurement process comprises reflectivity and the signal strength from the focus sensor 46 is used to determine the reflectivity. In an embodiment, a dedicated first measurement system is provided whose primary purpose is to provide information for optimizing the radiation used in the second measurement process. Other sensing schemes can be used, including for example ellipsometric or spectroscopic measurement modes. Using such sensing schemes, the first property of the structure may additionally or alternatively comprise an effect of the structure on the polarization of radiation scattered from the structure.

In an embodiment, a control system 48 controls the second measurement process such that a radiation property of radiation used to illuminate each structure during the second measurement process is individually selected for that structure using the measured first property for the structure. In an embodiment, a spectral distribution of intensity of the radiation is individually selected. The spectral distribution may comprise either or both of the central wavelength and/or bandwidth of the radiation. Alternatively or additionally, polarization of the radiation is individually selected. In an embodiment, the individual selection of the radiation property (e.g. wavelength) for the second measurement process for each structure is performed based on a previously measured correlation between the first property (e.g. reflectivity) and a choice of the radiation property (e.g. wavelength) for the second measurement process that enables a performance of the second measurement process (e.g. overlay measurement) to be higher than for other choices of the radiation property (e.g. wavelength) for the second measurement process.

Details are given below about how this can be achieved in the particular case where a signal strength from a focus sensor 46 is used to optimize a wavelength used in an overlay measurement. Reference is made to the mathematical analysis discussed above with reference to FIGS. 4 and 5.

In a typical focus measurement system, the focus sensor 46, can measure the total reflection from the substrate W with a large illumination NA. The focus sensor 46 can also detect the normally reflected radiation intensity. The expected relationship between the reflected 0th order signal and the measured overlay signal ΔI is described below.

The 0th order signal detected by the focus sensor 46 can be expressed as the sum of all the reflected and diffracted waves at the focus sensor wavelength. For simplicity, the following discussion considers only the reflection at normal incidence.

The reflected waves at normal incidence from the upper periodic structure 31 and lower periodic structure 32A,32B can be expressed as $$I_0 = \left| A_t + A_b e^{\frac{i4\pi d n}{\lambda_f}} \right|^2 =$$

$$A_t^2 + A_b^2 + 2 A_t A_b \cos\frac{4\pi n d}{\lambda_f} = \hat{A} + \hat{B}\cos\frac{\varphi}{\lambda_f} = \hat{A} + \hat{B}\cos\varphi \cdot v_f$$

where φ=4πnd, $\lambda_f$ is the focus sensor wavelength, and $v_f$ is the equivalent frequency.

As shown in the overlay signal analysis above, the ΔI term has a predominant wavelength dependence term $$\Delta I = 4|A||B|\sin\beta \cdot a = 4|A||B|\sin\frac{4\pi n d}{\lambda_m} \cdot \alpha = \hat{C}\sin\varphi \cdot v_m$$

where φ=4πnd, $\lambda_m$ is the metrology (overlay) measurement wavelength, and $v_m$ is the equivalent frequency. The other constants are written as $\hat{C}$.

The signal from the focus sensor 46 and the overlay signal are both dependent on the thin film thickness, d. This means that the variation in the thin film thickness, d, can be detected in the signal strength of the focus sensor 46 and appropriate corrections can be made to the wavelength used in the second measurement process (for measuring overlay).

Writing $v_f = v_m + \Delta v$, where Δv is the frequency separation, the signal $I_0$ can be written as $$I_0 = \hat{A} + \hat{B}\cos\varphi \cdot v_f$$
$$= \hat{A} + \hat{B}\cos\varphi(v_m + \Delta v)$$
$$= \hat{A} + \hat{B}(\cos\varphi \cdot v_m \cos\Delta v - \sin\varphi \cdot v_m \sin\Delta v)$$
$$= \hat{A} + \hat{B}(\sqrt{1 - \sin^2(\varphi \cdot v_m)}\cos\Delta v - \sin\varphi \cdot v_m \sin\Delta v)$$
$$I_0 = \hat{A} + \hat{B}\sqrt{1 - \frac{\Delta I^2}{C^2}}\cos\Delta v - \frac{\Delta I}{C}\sin\Delta v$$

Thus, the relationship between the signal strength from the focus sensor 46 and the sensitivity of the overlay signal can be expressed as a quadratic relationship. The signal strength of the focus sensor 46 can therefore be used to estimate how much the wavelength of the radiation used for the second measurement process needs to be adjusted.

The output from the focus sensor 46 can be used to infer variations of the target structure 30 (e.g. variations in the thickness of the thin film stack 33) that will affect the sensitivity of the second measurement process. In an embodiment, a shift in the curve of overlay sensitivity against wavelength (swing curve) is determined. The wavelength of the radiation used for the second measurement process can then be shifted by the same amount so that the second measurement process can be performed at the peak of the swing curve.

An example focus sensor 46 operates using radiation at two different wavelengths (e.g., 670 nm and 785 nm). The focus sensor 46 forms a radiation spot on the substrate W of, e.g., around 7 µm in size. The target structure 30 may be configured so that the radiation spot underfills the target structure 30. This means that the signal to the focus sensor 46 will not be corrupted by product structures outside of the target structure 30. The total reflected signal will also be independent of the overlay because the total reflected intensity is detected (all reflected orders).

When there is a process variation, the absolute reflectivity of each target structure 30 changes. It has been found that the absolute reflectivity at the two wavelengths is directly correlated with the optimum wavelength to use for measuring overlay in each target structure 30 (e.g., the peak of the swing curve).

In this example, the following steps can be used to adjust the wavelength of the second measurement process. In a first step, the focus sensor 46 is used to measure the absolute total reflectivities of the target structure 30 at each of the two wavelengths available. The total reflectivity can be measured for example by bringing the substrate W to optimum focus. At optimum focus, the signal strength from the focus sensor 46 is maximal. The signal strength from the focus sensor 46 is observed to vary as a function of position over the substrate W, reflecting variations in the properties of the thin film stack 33 over the substrate W. In a second step, the absolute reflectivity is compared with a previously measured correlation between the absolute reflectivity and an optimum choice of wavelength to determine a shift in the swing curve. In a third step, an output from the second radiation source 11 of the second measurement system 62 is adjusted prior to measurement of the target structure 30 using the second measurement system 62 (e.g. to obtain overlay).

Figure 7:
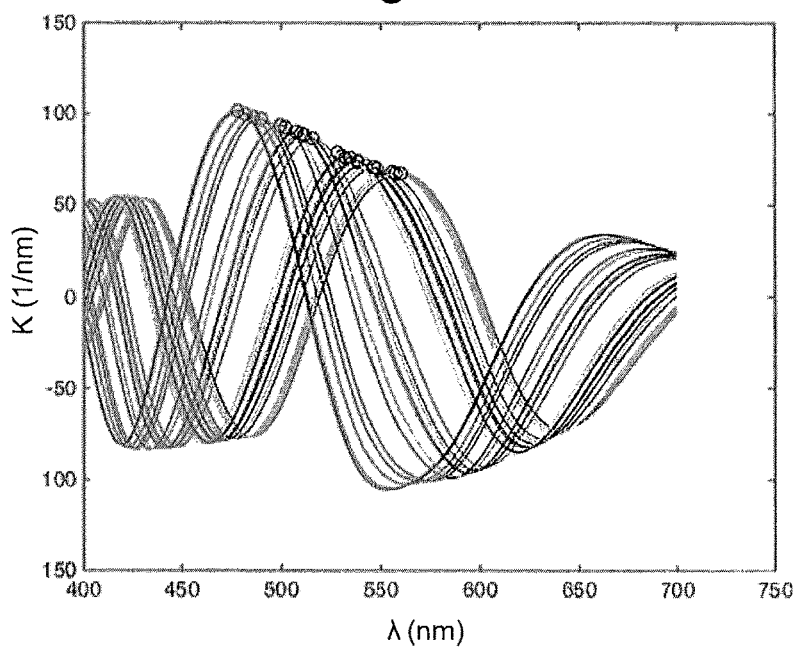
FIG. 7 depicts simulated curves of overlay sensitivity K against wavelength λ of measurement radiation (swing curves) for target structures having different thin film stack differences.
Figure 8:
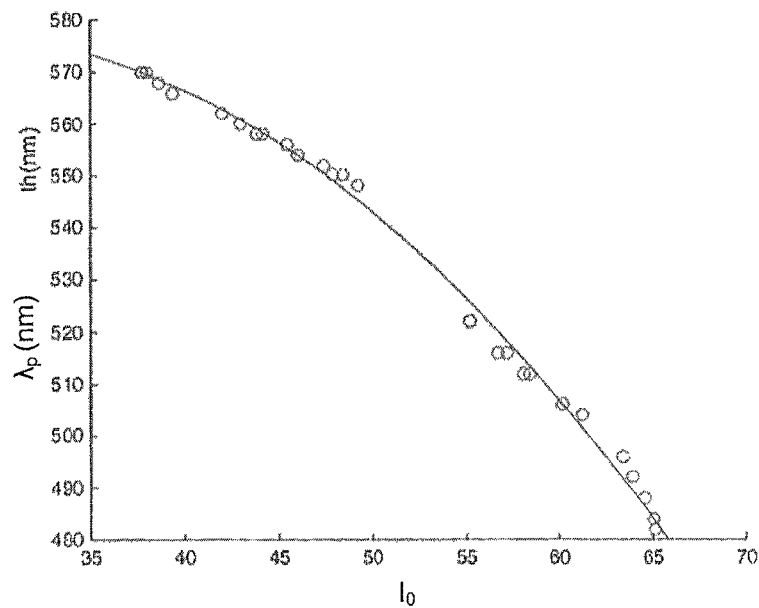
FIG. 8 is a graph depicting correlation between wavelengths $\lambda_P$ corresponding to peak positions in swing curves (e.g., optimum wavelengths) and signal strength $I_0$ from a sensor (e.g., a focus sensor)

Simulations have been performed to demonstrate the effectiveness of the technique. The simulations were performed by changing thin film stack thicknesses randomly and calculating the effect on the swing curves in each case. FIG. 7 depicts simulated swing curves of overlay sensitivity K against radiation wavelength λ for different thin film stack thicknesses (corresponding to target structures 30 located at different positions on the substrate W). The peak positions of the swing curves are marked with a circular mark and are spread over a range of wavelengths. The ideal wavelength to use for the overlay measurement therefore varies between different target structures 30. FIG. 8 shows how the wavelength $\lambda_p$ corresponding to each peak position correlates quadratically (almost linearly) with a signal strength $I_0$ from the focus sensor 46. The signal strength $I_0$ from the focus sensor 46 can therefore be used to determine the shift in the swing curve and allow optimal selection of the wavelength for overlay measurement for the target structure that has been measured by the focus sensor 46.

Figure 9:
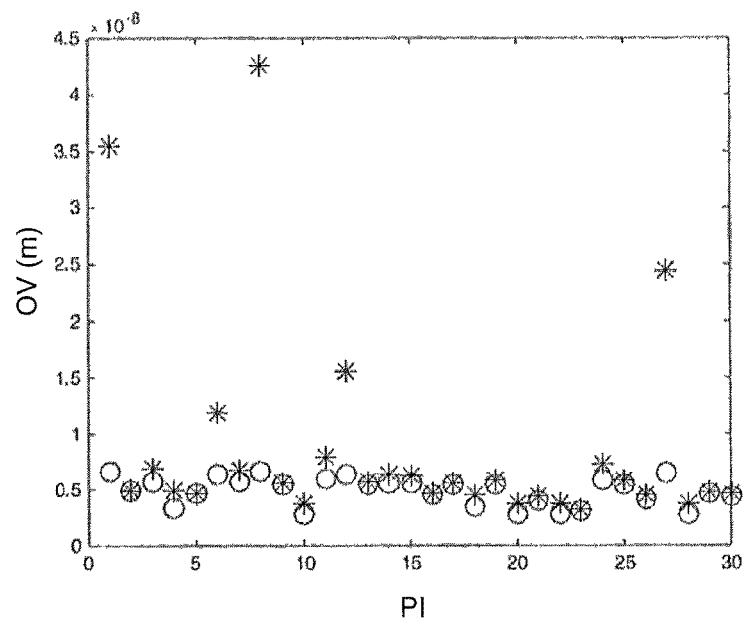
FIG. 9 is a graph comparing the results of overlay measurements that use a fixed wavelength to measure overlay in all target structures (star symbols) and the results of overlay measurements in which the wavelength is adapted for each target structure individually (circle symbols)

FIG. 9 compares the results of overlay measurements that use a fixed wavelength (520 nm in this example) to measure overlay in all target structures 30 (star symbols) and the results of overlay measurements in which the wavelength is adapted for each target structure 30 individually (circle symbols) using the focus sensor 46. FIG. 9 shows a total improvement (~7 nm) in final overlay if the illuminating wavelength is corrected before the measurement. The fixed wavelength approach has large outliers which are not present in the adaptive wavelength approach. It shows that the overlay error (i.e. the accuracy of the overlay measurement) can be improved by adjusting the central wavelength on a target by target basis. The improvement will be much larger for thick stacks where typically larger variations are present in the thin film thicknesses over the substrate.

The dependence between the optimum wavelength and the focus sensor signal can be modelled with a quadratic fit. The parameters of this fit can be calculated based on measurements of swing curves for different focus sensor signals during a calibration and recipe creation step and the results stored in a database.

In the detailed example discussed above, only two wavelengths were available. In an embodiment, the first measurement system 61 comprises a first radiation source 42 that illuminates each structure with broadband radiation and the control system 48 performs the individual selection of the radiation property for the second measurement process for each structure based on a spectroscopic analysis of the data from the first measurement process. This approach can provide more information about the optimum wavelength and further improve performance. Embodiments of this type could be implemented by providing a dedicated first measurement system or by modifying a focus measurement system such as that discussed above. A beam splitter could be used for example to direct the broadband radiation into the optical system 44 of the focus measurement system. A multimode fiber could be used to direct radiation reflected back through the optical system 44 to an appropriate spectrometer. The fiber could be provided at either or both of two pinholes for receiving the two wavelengths of the particular focus measurement system discussed above.

In a further embodiment, the focus measurement system could be converted to operate as an ellipsometer. This would allow measured polarization changes in the reflected radiation to be used to contribute to the estimation of an optimal wavelength.

In further embodiments, the first measurement process comprises one or more sub-processes. Thus, for example, instead of the first measurement process measuring reflectivity only using a focus or other sensor, the first measurement process may measure reflectivity using, e.g., the focus sensor (in one sub-process) and another property of the structure using the focus sensor or a different sensor (in another sub-process). The sub-processes may comprise at least one sub-process configured to measure a first property of the structure and at least one sub-process configured to measure a second property of the structure. A combination of the outputs from the plural sub-processes may be used to allow the individual selection per structure of the radiation property of the second measurement process to be performed even more efficiently.

In some embodiments of this type, the second property of the structure (e.g. overlay) is obtained via separate measurements of the structure at two different wavelengths. This approach may be referred to as dual wavelength metrology. In the case where the second property of the structure comprises overlay, the approach may be referred to as dual wavelength overlay metrology. In such dual wavelength metrology methods, one of the sub-processes of the first measurement process may comprise one of the two measurements at different wavelengths. The individual selection per structure of the radiation property for the second measurement process may then comprise selection of the other of the two wavelengths required for the dual wavelength metrology.

In some embodiments, the method comprises calculating a sensitivity of each of one or more of the sub-processes to the second property of the structure (e.g. overlay). In such embodiments, the individual selection per structure of the radiation property for the second measurement process is performed using one or more of the calculated sensitivities. This approach is based on the recognition that there is frequently a significant correlation between the sensitivity calculated for each of one or more of the sub-processes and an optimal radiation property (e.g. optimal wavelength) for the second measurement process. In an embodiment, the individual selection of the radiation property for the second measurement process is performed for each structure based on a previously measured correlation between each of one or more of the calculated sensitivities and a choice of the radiation property for the second measurement process that enables a performance of the second measurement process (e.g. an accuracy with which overlay can be obtained by the second measurement process) to be higher (e.g. more accurate) than for other choices of the radiation property for the second measurement process.

Information from different measurements may be combined mathematically, for example by calculating a maximum likelihood value of an optimal radiation property (e.g. an optimal second wavelength in a dual wavelength metrology method) using the different measurement results (e.g. sensitivities calculated from different sub-processes and/or measurements of reflectivity obtained from a sub-process using the focus sensor).

The individual selection per structure of the radiation property for the second measurement process may comprise selecting a central wavelength of a spectral distribution of intensity (referred to herein simply as "wavelength" for simplicity). Alternatively or additionally, the individual selection of the radiation property for the second measurement process may comprise selecting a polarization property (e.g. a direction of linear or circularly polarized radiation). Alternatively or additionally, the method may comprise individually selecting either or both of a wavelength and/or polarization property (e.g. a direction of linear or circularly polarized radiation) of redirected radiation detected during the second measurement process using one or more of the calculated sensitivities. Thus, either or both of wavelength and/or polarization of incident radiation and/or redirected radiation used in the second measurement process may be individually optimized for each structure on the substrate using information derived from the sub-processes of the first measurement process.

In an embodiment, the sub-processes of the first measurement process comprise one or more selected from: illuminating the structure with radiation having a first polarization property and detecting reflected radiation having a second polarization property; illuminating the structure with radiation having the second polarization property and detecting reflected radiation having the first polarization property; illuminating the structure with radiation having the first polarization property and detecting reflected radiation having the first polarization property; or illuminating the structure with radiation having the second polarization property and detecting reflected radiation having the second polarization property. The first polarization property is different to the second polarization property. In an embodiment, the first polarization property is orthogonal to the second polarization property (e.g. orthogonal linear polarizations or orthogonal circular polarizations). Thus, the sub-processes may comprise different detection modes corresponding to different combinations of polarizations for incident and detected polarizations, including co-polarized detection modes and cross-polarized detection modes. The sub-processes may comprise detection of zeroth or higher order reflectivities for any combination of the incident and detected polarizations. Metrics may be formed from combinations of sensitivities obtained for different detection modes. For example, where sensitivities $K_{TETM}$ and $K_{TMTE}$ are obtained for two opposite cross-polarized detection modes (the subscripts "TE" and "TM" referring to polarization modes that are orthogonal to each other), which may be opposite in sign to each other, the following metric, r, may be used:

$$r = \frac{K_{TETM} - K_{TMTE}}{K_{TETM} + K_{TMTE}}$$

Figure 10:
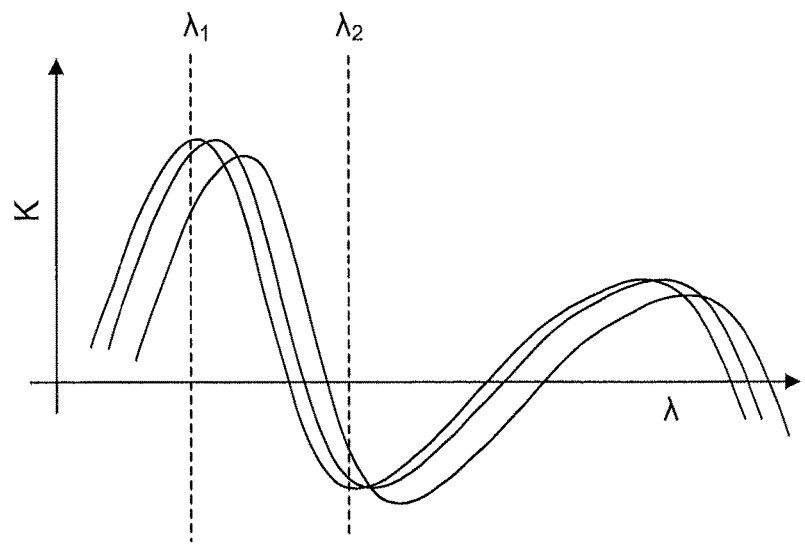
FIG. 10 is a graph depicting selection of wavelengths for a dual wavelength metrology method.

FIG. 10 depicts an example application of the method to dual wavelength metrology. In embodiments of this type, at least one of the sub-processes of the first measurement process is performed using the same measurement system (e.g. the second measurement system 62) as the second measurement process. The wavelength dependence of the sensitivity (e.g. the swing curve) of that sub-process for a given structure may thus be substantially the same as the wavelength dependence of the sensitivity of the second measurement process for the same structure. The dual wavelength metrology is achieved by configuring the sub-process using the same measurement system as the second measurement process to operate at a wavelength $\lambda_1$ and arranging for the second measurement process to operate at wavelength $\lambda_2$. The method then uses at least a measurement of the sensitivity to the second property of the structure measured at wavelength $\lambda_1$ to select an optimal value for $\lambda_2$.

In some embodiments, it is desirable for one of $\Delta_1$ or $\lambda_2$ to be located at or near to a maximum of the curve of sensitivity against wavelength and for the other of $\lambda_1$ or $\lambda_2$ to be located at or near to a minimum of the curve of sensitivity against wavelength. In the case where the second property of the structure comprises overlay OV, for example, a difference in intensity between different diffraction orders can be used to obtain OV using the following relationship: $\Delta I = K_0 + K_1 \cdot OV$, wherein $K_0$ is a process induced offset (independent of the structure) and $K_1$ represents a sensitivity of the measurement process to OV. In this particular example, it can be shown that the error E can be written as follows:

$$\epsilon = \frac{\Delta K_0}{\Delta K_1} d$$

where d is the overlay bias applied to periodic structures used in the measurement. Choosing $\lambda_1$ and $\lambda_2$ to be on opposite sides of the curve of sensitivity against wavelength (e.g., with one a minimum and one a maximum) ensures that $\Delta K_1$ is large and the error is small.

FIG. 10 shows three example curves of sensitivity against wavelength. The three curves may correspond to curves measured for different structures on the substrate for example. The curves each have a similar form and are displaced relative to each other along the wavelength direction. Optimal values for $\lambda_1$ and $\lambda_2$ are different for each curve. However, it has been found (and can be seen qualitatively in FIG. 10) that there is a correlation between the sensitivity K measured at $\lambda_1$ (e.g. at or near a peak of the curve of sensitivity against wavelength) and the corresponding optimal value for $\lambda_2$. The peak heights are not the same for each of the curves. The peak height at $\lambda_1$ thus provides information about which curve most closely applies to the structure being measured and therefore provides information about where an extremum (e.g., minimum) corresponding to an optimal value for $\lambda_2$ may be located.

In an embodiment, an optimal value for $\lambda_1$ is determined in a first optimization process. The first optimization process may, for example, use measurements of the structure in question using the focus sensor, for example to obtain reflectivity of the structure, according to any of the embodiments described above. The optimal value of $\lambda_2$ may then be obtained in a subsequent process using at least a sensitivity calculated from measurements performed at the optimized value of $\lambda_1$.

Figure 11:
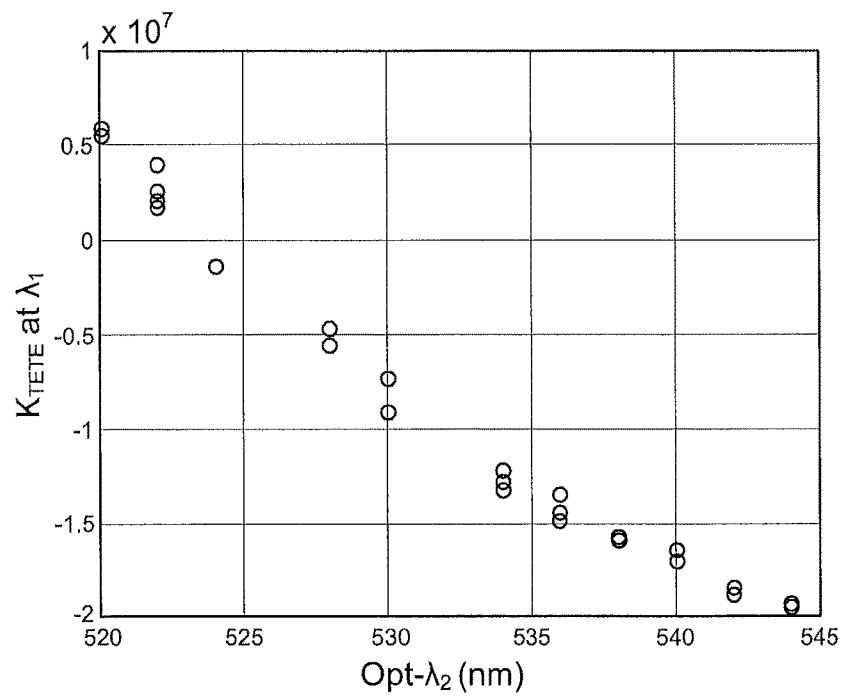
FIG. 11 is a graph depicting correlation between a sensitivity measured at a first wavelength of a dual wavelength metrology method and an optimal value for a second wavelength.

FIG. 11 is a graph showing example sensitivities $K_{TETE}$ calculated from measurements performed at $\Delta 1$ plotted against corresponding optimal values Opt-$\lambda_2$ for $\lambda_2$ (each corresponding to a trough in the curve of sensitivity against wavelength for the structure being measured). In this particular example, the measurements were performed with co-polarized, linear polarized radiation (TE polarization) for both incident and reflected radiation.

Figure 12:
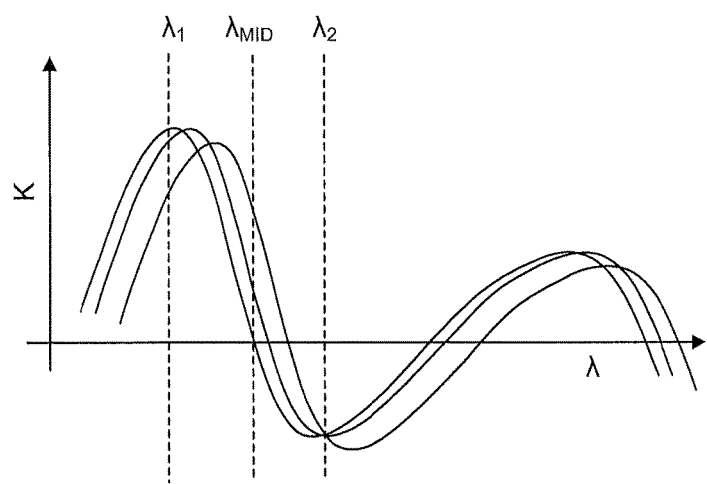
FIG. 12 is a graph depicting selection of a second wavelength for a dual wavelength metrology method based on sensitivity measured at an intermediate wavelength.

As can be seen in FIG. 10, the change in sensitivity Kat or near the peak corresponding to $\lambda_1$ changes relatively slowly moving from one curve to the next. To increase the sensitivity with which the optimal value of $\lambda_2$ can be derived based on the sensitivity K for $\lambda_1$, the sensitivity K at an intermediate position between the maximum and minimum in the curve of sensitivity against wavelength can be used instead. An example approach is illustrated in FIG. 12. The sensitivity K at the midpoint $\lambda_{MID}$ changes much more quickly moving from one curve to the next curve and therefore allows the optimal $\lambda_2$ to be obtained more accurately. An embodiment based on this effect is described below.

In an embodiment, the plurality of sub-processes comprises a first sub-process and a second sub-process. A wavelength dependence of the sensitivity of the first sub-process to the second property (e.g. overlay) of the structure is substantially the same as the wavelength dependence of the second sub-process to the second property of the structure and comprises a local maximum and a local minimum (as in FIGS. 10 and 12).

The first sub-process comprises illuminating the structure with radiation having a central wavelength aligned with one of the local maximum and the local minimum, within a range of 10%, optionally 5%, optionally 1%, of the wavelength separation between the local maximum and the local minimum. Thus, the first sub-process may comprise illuminating the structure with a wavelength $\lambda_1$ at or near the peak in FIG. 12.

The second sub-process comprises illuminating the structure with radiation having a central wavelength aligned with a midpoint between the local maximum and the local minimum, within a range of 40%, optionally 20%, optionally 10%, optionally 5%, optionally 1%, of the wavelength separation between the local maximum and the local minimum. Thus, the second sub-process may comprise illuminating the structure with a wavelength at or near the estimated midpoint $\Delta_{MID}$ between $\lambda_1$ and $\lambda_2$ in FIG. 12. A sensitivity to the second property (e.g. overlay sensitivity) obtained at $\Delta_{MID}$ is then used to derive an optimal value for the second wavelength $\lambda_2$, optionally in combination with information provided by other sub-processes of the first measurement process (e.g. reflectivity from focus sensor measurements, a sensitivity obtained when measuring at $\lambda_1$ and one or more other sensitivities obtained from sub-processes based on other detection modes).

The concepts disclosed herein may find utility beyond post-lithography measurement of structures for monitoring purposes. For example, such a detector architecture may be used in future alignment sensor concepts that are based on pupil plane detection, used in lithographic apparatuses for aligning the substrate during the patterning process.

While the targets described above are metrology targets specifically designed and formed for the purposes of measurement, in other embodiments, properties may be measured on targets which are functional parts of devices formed on the substrate. Many devices have regular, grating-like structures. The terms 'target grating', 'target periodic structure', 'target' and similar wording as used herein do not require that the structure has been provided specifically for the measurement being performed.

The metrology apparatus can be used in a lithographic system, such as the lithographic cell LC discussed above with reference to FIG. 2. The lithographic system comprises a lithographic apparatus LA that performs a lithographic process. The lithographic apparatus may be configured to use the result of a measurement by the metrology apparatus of a structure formed by the lithographic process when performing a subsequently lithographic process, for example to improve the subsequent lithographic process.

In an embodiment, the results from methods herein may be used in the design, control or modification of any process or of any physical object (e.g., target, patterning device, etc.) or apparatus (e.g., metrology apparatus) used or manufactured in the process.

An embodiment may include a computer program containing one or more sequences of machine-readable instructions describing methods of measuring targets on a structures and/or analyzing measurements to obtain information about a lithographic process. There may also be provided a data storage medium (e.g., semiconductor memory, magnetic or optical disk) having such a computer program stored therein. Where an existing lithography or metrology apparatus is already in production and/or in use, an embodiment of the invention can be implemented by the provision of updated computer program products for causing a processor to perform a method, or portion thereof, described herein.

Further embodiments according to the invention are described in below numbered clauses:
1. A method of measuring a plurality of structures formed on a substrate, the method comprising:
    obtaining data from a first measurement process, the first measurement process comprising individually measuring each of the plurality of structures to measure a first property of the structure; and
    using a second measurement process to measure a second property of each of the plurality of structures, the second measurement process comprising illuminating each structure with radiation having a radiation property that is individually selected for that structure using the measured first property for the structure.
2. The method of clause 1, wherein the individual selection of the radiation property for the second measurement process is performed for each structure based on a previously measured correlation between the first property and a choice of the radiation property for the second measurement process that enables a performance of the second measurement process to be higher than for other choices of the radiation property for the second measurement process.
3. The method of clause 1 or clause 2, wherein the first property of the structure comprises reflectivity.
4. The method of any preceding clause, wherein the first property of the structure comprises an effect of the structure on the polarization of radiation scattered from the structure.
5. The method of any preceding clause, wherein the second property of each structure comprises overlay between different layers of the structure.
6. The method of any preceding clause, wherein the radiation property for the second measurement process comprises a spectral distribution of intensity.
7. The method of clause 6, wherein the spectral distribution of intensity comprises one or both of central wavelength and bandwidth.
8. The method of any preceding clause, wherein the radiation property for the second measurement process comprises a polarization of the radiation.
9. The method of any preceding clause, wherein:
    the first measurement process uses a first radiation source to illuminate each structure with radiation; and
    the second measurement process uses a second radiation source to illuminate each structure with radiation, wherein the first radiation source is different from the second radiation source.
10. The method of any preceding clause, wherein the first measurement process uses the output from a focus sensor configured to measure a focus of an optical system used for the second measurement process.
11. The method of clause 10, wherein the first property of the structure comprises reflectivity and the signal strength from the focus sensor is used to determine the reflectivity.
12. The method of any preceding clause, wherein the first measurement process uses one or more optical elements that are also used when measuring a focus of an optical system used for the second measurement process, wherein the one or more optical elements are not used when performing the second measurement process.
13. The method of any preceding clause, wherein the first measurement process uses a first radiation source to illuminate each structure with broadband radiation and the individual selection of the radiation property for the second measurement process is performed for each structure based on a spectroscopic analysis of the data from the first measurement process.
14. The method of any preceding clause, comprising performing the first measurement process.
15. The method of clause 1, wherein:
    the first measurement process comprises one or more sub-processes;
    the method comprises calculating a sensitivity of each of one or more of the sub-processes to the second property of the structure; and
    the individual selection of the radiation property for the second measurement process is performed using one or more of the calculated sensitivities.
16. The method of clause 15, wherein the individual selection of the radiation property for the second measurement process is performed for each structure based on a previously measured correlation between each of one or more of the calculated sensitivities and a choice of the radiation property for the second measurement process that enables a performance of the second measurement process to be higher than for other choices of the radiation property for the second measurement process.

17. The method of clause 15 or clause 16, wherein the individual selection of the radiation property for the second measurement process comprises selecting a central wavelength of a spectral distribution of intensity.

18. The method of any of clauses 15-17, wherein the individual selection of the radiation property for the second measurement process comprises selecting a polarization property.

19. The method of any of clauses 15-18, further comprising individually selecting a polarization property of reflected radiation detected during the second measurement process using one or more of the calculated sensitivities.

20. The method of any of clauses 15-19, wherein the sub-processes comprise one or more selected from:
    illuminating the structure with radiation having a first polarization property and detecting reflected radiation having a second polarization property;
    illuminating the structure with radiation having the second polarization property and detecting reflected radiation having the first polarization property;
    illuminating the structure with radiation having the first polarization property and detecting reflected radiation having the first polarization property; and
    illuminating the structure with radiation having the second polarization property and detecting reflected radiation having the second polarization property, wherein:
    the first polarization property is different to the second polarization property.

21. The method of clause 20, wherein the first polarization property is orthogonal to the second polarization property.

22. The method of any of clauses 15-21, wherein:
    the sub-processes comprise a first sub-process and a second sub-process;
    a wavelength dependence of the sensitivity of the first sub-process to the second property of the structure is substantially the same as the wavelength dependence of the second sub-process to the second property of the structure and comprises a local maximum and a local minimum;
    the first sub-process comprises illuminating the structure with radiation having a central wavelength aligned with one of the local maximum and the local minimum, within a range of 10% of the wavelength separation between the local maximum and the local minimum; and
    the second sub-process comprises illuminating the structure with radiation having a central wavelength aligned with a midpoint between the local maximum and the local minimum, within a range of 40% of the wavelength separation between the local maximum and the local minimum.

23. The method of any of clauses 15-22, wherein the sub-processes comprise at least one sub-process configured to measure the first property of the structure and at least one sub-process configured to measure the second property of the structure.

24. The method of clause 23, wherein the first property of the structure comprises reflectivity and the second property of the structure comprises overlay between different layers of the structure.

25. The method of clause 23 or clause 24, further comprising determining an improved value of the second property of the structure using a combination of the second property obtained using a sub-process of the first measurement process and the second property obtained using the second measurement process.

26. The method of any preceding clause, wherein the plurality of structures formed on the substrate are formed by a lithographic process.

27. A device manufacturing method, comprising
    forming a plurality of structures on a substrate using lithography; and
    measuring the plurality of structures using the method of any preceding clause.

28. A metrology apparatus for measuring a plurality of structures on a substrate, the metrology apparatus comprising:
    a first measurement system configured to perform a first measurement process, the first measurement process comprising individually measuring each of the plurality of structures to measure a first property of the structure;
    a second measurement system configured to perform a second measurement process, the second measurement process comprising measuring a second property of each of the plurality of structures; and
    a controller configured to control the second measurement process such that a radiation property of radiation used to illuminate each structure during the second measurement process is individually selected for that structure using the measured first property for the structure.

29. The apparatus of clause 28, wherein the controller is configured to perform the individual selection of the radiation property for the second measurement process for each structure based on a previously measured correlation between the first property and a choice of the radiation property for the second measurement process that enables a performance of the second measurement process to be higher than for other choices of the radiation property for the second measurement process.

30. The apparatus of clause 28 or clause 29, wherein the first property of the structure comprises reflectivity.

31. The apparatus of any of clauses 28-30, wherein the first property of the structure comprises an effect of the structure on the polarization of radiation scattered from the structure.

32. The apparatus of any of clauses 28-31, wherein the second property of each structure comprises overlay between different layers of the structure.

33. The apparatus of any of clauses 28-32, wherein the radiation property for the second measurement process comprises a spectral distribution of intensity.

34. The apparatus of clause 33, wherein the spectral distribution of intensity comprises one or both of central wavelength and bandwidth.

35. The apparatus of any of clauses 28-34, wherein the radiation property for the second measurement process comprises a polarization of the radiation.

36. The apparatus of any of clauses 28-35, wherein:
    the first measurement system comprises a first radiation source configured to illuminate each structure with radiation; and
    the second measurement system comprises a second radiation source configured to illuminate each structure with radiation, wherein the first radiation source is different from the second radiation source.

37. The apparatus of any of clauses 28-36, wherein the apparatus comprises a focus measurement system comprising a focus sensor configured to measure a focus of an optical system used by the second measurement system, and the first measurement process uses an output from the focus sensor.

38. The apparatus of clause 37, wherein the first property of the structure comprises reflectivity and the signal strength from the focus sensor is used to determine the reflectivity.
39. The apparatus of any of clauses 28-38, wherein the first measurement system comprises one or more optical elements that are also used by a focus measurement system configured to measure a focus of an optical system used by the second measurement system, wherein the one or more optical elements are not used by the second measurement system.
40. The apparatus of any of clauses 28-39, wherein the first measurement system comprises a first radiation source configured to illuminate each structure with broadband radiation and the controller is configured to perform the individual selection of the radiation property for the second measurement process for each structure based on a spectroscopic analysis of the data from the first measurement process.
41. The apparatus of any of clauses 28-40, wherein the plurality of structures formed on the substrate are formed by a lithographic process.
42. A lithographic system comprising:
    a lithographic apparatus configured to form a plurality of structures on a substrate using lithography; and
    the metrology apparatus of any of clauses 28-41 configured to measure the plurality of structures formed by the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:
1. A method of measuring a plurality of structures formed on a substrate, the method comprising:
   obtaining data from a first measurement process, the first measurement process comprising individually measuring each of the plurality of structures to measure a first property of the structure; and
   using a second measurement process to measure a second property of each of the plurality of structures, the second measurement process comprising illuminating each structure with radiation having a radiation property that is individually selected for that structure using the measured first property for the structure.
2. The method of claim 1, wherein the individual selection of the radiation property for the second measurement process is performed for each structure based on a previously measured correlation between the first property and a choice of the radiation property for the second measurement process that enables a performance of the second measurement process to be higher than for other choices of the radiation property for the second measurement process.
3. The method of claim 1, wherein the first property of the structure comprises reflectivity.
4. The method of claim 1, wherein the first property of the structure comprises an effect of the structure on the polarization of radiation scattered from the structure.
5. The method of claim 1, wherein the second property of each structure comprises overlay between different layers of the structure.
6. The method of claim 1, wherein the radiation property for the second measurement process comprises a spectral distribution of intensity.
7. The method of claim 6, wherein the spectral distribution of intensity comprises central wavelength and/or bandwidth.
8. The method of claim 1, wherein the radiation property for the second measurement process comprises a polarization of the radiation.
9. The method of claim 1, wherein:
   the first measurement process uses a first radiation source to illuminate each structure with radiation; and the second measurement process uses a second radiation source to illuminate each structure with radiation, wherein the first radiation source is different from the second radiation source.

10. The method of claim 1, wherein the first measurement process uses the output from a focus sensor configured to measure a focus of an optical system used for the second measurement process.

11. The method of claim 10, wherein the first property of the structure comprises reflectivity and the signal strength from the focus sensor is used to determine the reflectivity.

12. The method of claim 1, wherein the first measurement process uses one or more optical elements that are also used when measuring a focus of an optical system used for the second measurement process, wherein the one or more optical elements are not used when performing the second measurement process.

13. The method of claim 1, wherein the first measurement process uses a first radiation source to illuminate each structure with broadband radiation and the individual selection of the radiation property for the second measurement process is performed for each structure based on a spectroscopic analysis of the data from the first measurement process.

14. The method of claim 1, comprising performing the first measurement process.

15. The method of claim 1, wherein the plurality of structures formed on the substrate are formed by a lithographic process.

16. A metrology apparatus for measuring a plurality of structures on a substrate, the metrology apparatus comprising:
a first measurement system configured to perform a first measurement process, the first measurement process comprising individually measuring each of the plurality of structures to measure a first property of the structure;
a second measurement system configured to perform a second measurement process, the second measurement process comprising measuring a second property of each of the plurality of structures; and
a control system configured to control the second measurement process such that a radiation property of radiation used to illuminate each structure during the second measurement process is individually selected for that structure using the measured first property for the structure.

17. The apparatus of claim 16, wherein the control system is configured to perform the individual selection of the radiation property for the second measurement process for each structure based on a previously measured correlation between the first property and a choice of the radiation property for the second measurement process that enables a performance of the second measurement process to be higher than for other choices of the radiation property for the second measurement process.

18. The apparatus of claim 16, wherein the first property of the structure comprises reflectivity or an effect of the structure on the polarization of radiation scattered from the structure.

19. The apparatus of claim 16, wherein the second property of each structure comprises overlay between different layers of the structure.

20. A non-transitory computer-readable medium comprising instructions, when executed, configured to cause a computer system to at least:
obtain data from a first measurement process, the first measurement process comprising individually measuring each of a plurality of structures formed on a substrate to measure a first property of the structure; and
cause use of a second measurement process to measure a second property of each of the plurality of structures, the second measurement process comprising illuminating each structure with radiation having a radiation property that is individually selected for that structure using the measured first property for the structure.

* * * * *